(12) United States Patent
Glew et al.

(10) Patent No.: US 9,554,487 B2
(45) Date of Patent: Jan. 24, 2017

(54) MICROCHANNEL HEAT TRANSFER WITH LIQUID METALS

(71) Applicant: Elwha LLC, Bellevue, WA (US)

(72) Inventors: Andrew F. Glew, Hillsboro, OR (US); Roderick A. Hyde, Redmond, WA (US); Jordin T. Kare, Seattle, WA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 1056 days.

(21) Appl. No.: 13/627,509

(22) Filed: Sep. 26, 2012

(65) Prior Publication Data

US 2015/0257306 A1    Sep. 10, 2015

(51) Int. Cl.
*H05K 7/20* (2006.01)
*F28F 7/02* (2006.01)
*F28F 27/02* (2006.01)

(52) U.S. Cl.
CPC ........... *H05K 7/20272* (2013.01); *F28F 27/02* (2013.01); *H05K 7/20254* (2013.01); *H05K 7/20281* (2013.01)

(58) Field of Classification Search
CPC ............ H05K 7/20254; H05K 7/20272; H05K 7/20281; H01L 23/473; H01L 23/3736; F28F 27/02
USPC .......................... 165/104.23, 104.28, 104.33
See application file for complete search history.

(56) References Cited

U.S. PATENT DOCUMENTS

| | | | |
|---|---|---|---|
| 5,107,920 A | 4/1992 | Scotti et al. | |
| 5,238,056 A | 8/1993 | Scotti et al. | |
| 5,632,876 A * | 5/1997 | Zanzucchi | B01F 13/0077 204/600 |
| 6,146,103 A * | 11/2000 | Lee | F16K 99/0001 417/50 |
| 6,733,244 B1 * | 5/2004 | Fritsch | B01F 13/0077 417/48 |
| 7,301,770 B2 | 11/2007 | Campbell et al. | |
| 7,340,904 B2 | 3/2008 | Sauciuc et al. | |
| 7,436,059 B1 | 10/2008 | Ouyang | |
| 7,511,372 B2 | 3/2009 | Chiu | |
| 7,539,016 B2 | 5/2009 | Sauciuc et al. | |
| 7,763,973 B1 * | 7/2010 | Bratkovski | H01L 23/473 257/685 |
| 7,781,263 B2 | 8/2010 | Winter et al. | |
| 7,870,893 B2 * | 1/2011 | Ouyang | H01L 23/473 165/104.31 |
| 8,022,535 B2 | 9/2011 | Winter et al. | |
| 2005/0145371 A1 | 7/2005 | DiStefano et al. | |
| 2006/0131003 A1 | 6/2006 | Chang et al. | |

(Continued)

*Primary Examiner* — Len Tran
*Assistant Examiner* — Hans Weiland
(74) *Attorney, Agent, or Firm* — Foley & Lardner LLP

(57) ABSTRACT

A apparatus for controlling heat transfer between portions of a substrate is provided. The apparatus includes a substrate including at least part of a hydraulic circuit, the hydraulic circuit including a plurality of microconduits, the plurality of microconduits including a first microconduit and a second microconduit. The apparatus further includes a liquid metal flowing through the hydraulic circuit and a magnetic field configured to selectively direct the flow of the liquid metal between the plurality of microconduits. The flow of the liquid metal through the hydraulic circuit transfers heat between a first portion of the substrate and the liquid metal.

20 Claims, 9 Drawing Sheets

(56) References Cited

U.S. PATENT DOCUMENTS

| | | |
|---|---|---|
| 2006/0187638 A1 | 8/2006 | Vinson et al. |
| 2007/0017659 A1 | 1/2007 | Brunschwiler et al. |
| 2007/0121299 A1 | 5/2007 | Campbell et al. |
| 2009/0053106 A1* | 2/2009 | Wu .................. B01L 3/502746 422/68.1 |
| 2009/0126922 A1 | 5/2009 | Vetrovec |
| 2009/0226971 A1 | 9/2009 | Beer et al. |
| 2009/0226972 A1 | 9/2009 | Beer et al. |
| 2009/0307646 A1 | 12/2009 | Winter et al. |
| 2009/0308081 A1 | 12/2009 | Ouyang et al. |
| 2010/0064518 A1 | 3/2010 | Lower et al. |
| 2010/0064695 A1 | 3/2010 | Wilcoxon et al. |
| 2010/0065256 A1 | 3/2010 | Wilcoxon et al. |
| 2010/0066178 A1 | 3/2010 | Lower et al. |
| 2010/0071883 A1 | 3/2010 | Vetrovec |
| 2010/0186935 A1* | 7/2010 | Wand ..................... F25B 39/04 165/173 |
| 2010/0195074 A1 | 8/2010 | Sogard |

\* cited by examiner

MICROCHANNEL HEAT TRANSFER WITH LIQUID METALS

BACKGROUND

The present application relates generally to the field of microchannel heat transfer systems. The present application relates more specifically to microchannel heat transfer systems for computer equipment using liquid metals.

Computing systems generate large quantities of waste heat that must be removed from the computing system for the computing electronics to run at optimal efficiency. Conventional cooling systems use forced air to convectively cool the electronics. Other systems use liquid to carry heat between a heat sink and a radiator remote from the electronics. As computing systems, for example graphics processing units, become more powerful and generate more waste heat, there is a need for improved heat transfer systems.

SUMMARY

One embodiment relates to an apparatus for controlling heat transfer between portions of a substrate. The apparatus includes a substrate including at least part of a hydraulic circuit, the hydraulic circuit having a plurality of microconduits, the plurality of microconduits including a first microconduit and a second microconduit. The apparatus further includes a liquid metal flowing through the hydraulic circuit and a magnetic field configured to selectively direct the flow of the liquid metal between the plurality of microconduits. The flow of the liquid metal through the hydraulic circuit transfers heat between a first portion of the substrate and the liquid metal.

Another embodiment relates to an apparatus for controlling heat transfer between portions of a microcomponent. The apparatus includes a microcomponent having a microconduit, a liquid metal flowing through the microconduit, and a magnetic field configured to control the flow of the liquid metal. The flow of the liquid metal through the microconduit transfers heat between a first portion of the microcomponent to and the liquid metal.

Another embodiment relates to an apparatus for controlling heat transfer between portions of a substrate. The apparatus includes a substrate including at least part of a hydraulic circuit, the hydraulic circuit comprising at least two microconduits; a liquid metal flowing through the hydraulic circuit; and an electric field configured to selectively direct the flow of the liquid metal between the at least two microconduits. The flow of the liquid metal through the hydraulic circuit transfers heat between a first portion of the substrate and the liquid metal.

Another embodiment relates to an apparatus for controlling heat transfer between portions of a microcomponent. The apparatus includes a microcomponent including at least part of a hydraulic circuit, the hydraulic circuit including at least two microconduits; a liquid metal flowing through the hydraulic circuit; and an electric field configured to selectively direct the flow of the liquid metal between the at least two microconduits. The flow of the liquid metal through the hydraulic circuit transfers heat between a first portion of the microcomponent and the liquid metal.

Another embodiment relates to a method of controlling heat transfer between portions of a substrate. The method includes the step of providing a substrate, the substrate including at least part of a hydraulic circuit, the hydraulic circuit comprising a liquid metal therein and comprising a plurality of microconduits, the plurality of microconduits including a first microconduit and a second microconduit. The method further includes the steps of applying a magnetic field to the liquid metal and directing the flow of the liquid metal between the plurality of microconduits in response to the magnetic field. The flow of the liquid metal through the hydraulic circuit transfers heat between a first portion of the substrate and the liquid metal.

Another embodiment relates to a method of controlling heat transfer between portions of a microcomponent. The method includes providing a microcomponent, the microcomponent including a first microconduit; applying a magnetic field to the liquid metal; and controlling the flow of the liquid metal in response to the magnetic field. The flow of the liquid metal through the microconduit transfers heat between a first portion of the microcomponent and the liquid metal.

The foregoing is a summary and thus by necessity contains simplifications, generalizations and omissions of detail. Consequently, those skilled in the art will appreciate that the summary is illustrative only and is not intended to be in any way limiting.

BRIEF DESCRIPTION OF THE DRAWINGS

Aspects, inventive features, and advantages of the present invention, as defined solely by the claims, will become apparent from the following description, and the accompanying exemplary embodiments shown in the drawings, which are briefly described below.

DETAILED DESCRIPTION

Referring generally to the FIGURES, a heat transfer system for a microcomponent coupled to a substrate, and components thereof, are shown according to an exemplary embodiment. The heat transfer system includes a heat transfer medium such as a fluid (e.g., liquid, liquid metal, etc.) flowing through one or more microconduits. According to one embodiment, the microconduits are located in the microcomponent; in another embodiment, the microconduits are located in the substrate; and in another embodiment, the microconduits travel between the microcomponent and substrate. Flow of the fluid through the microconduits transfers heat between the fluid and a first portion of the microcomponent or substrate.

Before discussing further details of the heat transfer apparatus and/or the components thereof, it should be noted that references to "front," "back," "rear," "upward," "downward," "inner," "outer," "right," and "left" in this description are merely used to identify the various elements as they are oriented in the FIGURES. These terms are not meant to limit the element which they describe, as the various elements may be oriented differently in various applications.

It should further be noted that for purposes of this disclosure, the term coupled means the joining of two members directly or indirectly to one another. Such joining may be stationary in nature or moveable in nature and/or such joining may allow for the flow of fluids, electricity, electrical signals, or other types of signals or communication between the two members. Such joining may be achieved with the two members or the two members and any additional intermediate members being integrally formed as a single unitary body with one another or with the two members or the two members and any additional intermediate members being attached to one another. Such joining may be permanent in nature or alternatively may be removable or releasable in nature.

Figure 1:
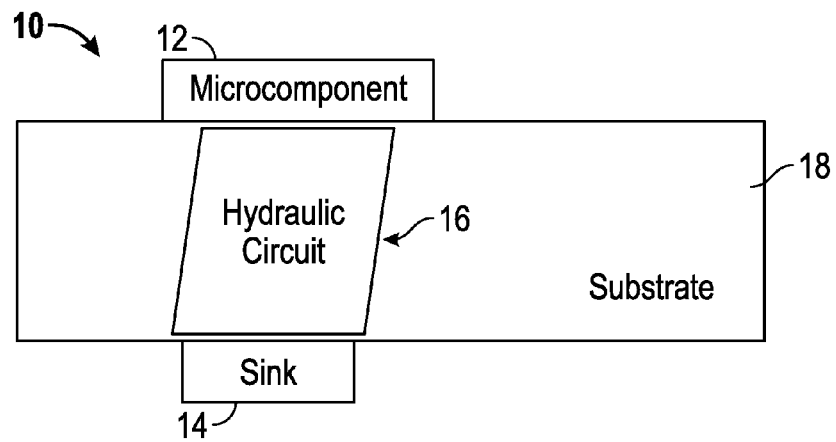
FIG. 1 is a schematic block diagram of a heat transfer system, shown according to an exemplary embodiment.

Referring to FIG. 1, a heat transfer system 10 is utilized to transfer heat from a first portion or region to a second portion or region. Heat is transferred between (e.g., to or from) the first or second region and a heat transfer medium such as a fluid (e.g., liquid, liquid metal, etc., described in detail below) flowing through a network of one or more hydraulic circuits 16 (e.g., fluid circuit, circuit, etc.). The flow of the fluid through the hydraulic circuit 16 transfers heat from one region to another. In one embodiment, for example, the first region may be a microcomponent 12 or a surface exposed to a heat source and the second region may be a component such as a heat sink 14 that is configured to dissipate the transferred heat to the surrounding air. The heat sink 14 may include structures such as pins or fins to increase the transfer of heat to the surrounding air. Hydraulic circuits 16 may couple multiple microcomponents 12 to the same heat sink 14 or may couple a single microcomponent 12 to multiple heat sinks 14.

In other embodiments, the second region may be another region configured to allow the fluid in the circuit 16 to transfer heat to an external system by some heat transfer mechanism (e.g., conduction, convection, or radiation). In another embodiment, the hydraulic circuit 16 may be utilized to transfer heat from a first microcomponent that is to be cooled, and transfer the heat to a second component that is to be heated, for example, to raise its temperature to an initial operating temperature.

The microcomponent 12 may be any device that benefits from or facilitates a heat transfer system including, but not limited to, a computer chip (e.g., a central processing unit, a graphics processing unit, etc.), memory (e.g., random access memory (RAM), etc.), a laser diode, a light emitting diode (LED), an optical switch, an ultrasonic transducer, etc. The microcomponent 12 and the heat sink 14 may each be built into the substrate 18 or may be separably or permanently coupled to a substrate 18. The substrate 18 may be formed of any suitable material (e.g., silicon, silicon dioxide, aluminum dioxide, aerogel, etc.). The substrate 18 may be a board or may be an active component. According to various embodiments, the substrate 18 may act as a heat sink and the hydraulic circuit 16 may transfer heat from the microcomponent 12 to the substrate 18. The hydraulic circuit 16 may be contained completely within (or on the surface of) the substrate 18.

Figure 2:
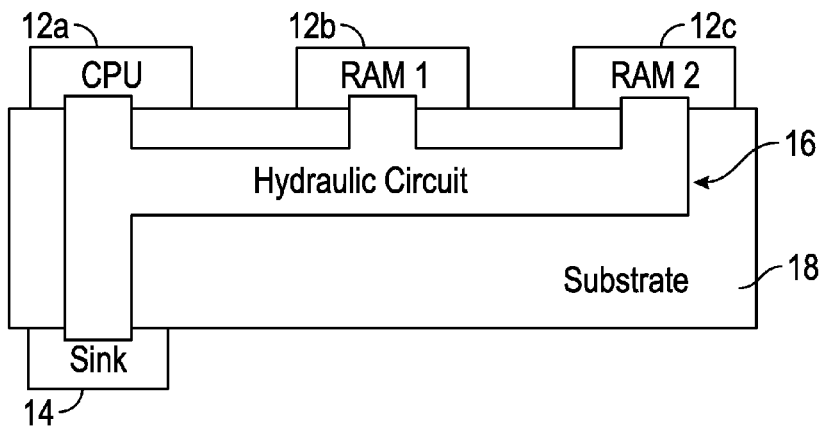
FIG. 2 is a schematic block diagram of a heat transfer system with a hydraulic circuit disposed in a substrate, according to an exemplary embodiment.

Referring to FIG. 2, in other embodiments, the hydraulic circuit 16 may thermally interact with and flow between one or more microcomponents 12, shown as a CPU microcomponent 12a, a first RAM microcomponent 12b, and a second RAM microcomponent 12c, each of which are supported by the substrate 18. Heat from each of the microcomponents 12a-12c may be transferred to a component such as a heat sink 14.

Figure 3:
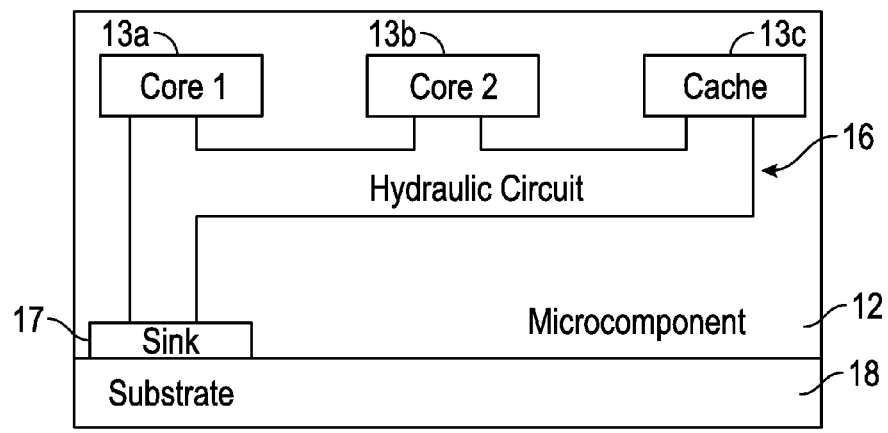
FIG. 3 is a schematic block diagram of a heat transfer system with a hydraulic circuit disposed in a microcomponent, according to an exemplary embodiment.

Referring to FIG. 3, in other embodiments, the hydraulic circuit 16 may be contained completely within (or on the surface of) the microcomponent 12. The hydraulic circuit 16 may thermally interact between several subcomponents or regions of a microcomponent 12. In an embodiment where the microcomponent 12 is a computer chip, the hydraulic circuit 16 may be coupled to multiple regions, such as multiple cores 13a and 13b, a cache 15 and an integral heat sink 17. As shown, the heat sink 17 may transfer heat to the substrate 18. According to another embodiment, the substrate 18 may be the heat sink.

Figure 4:
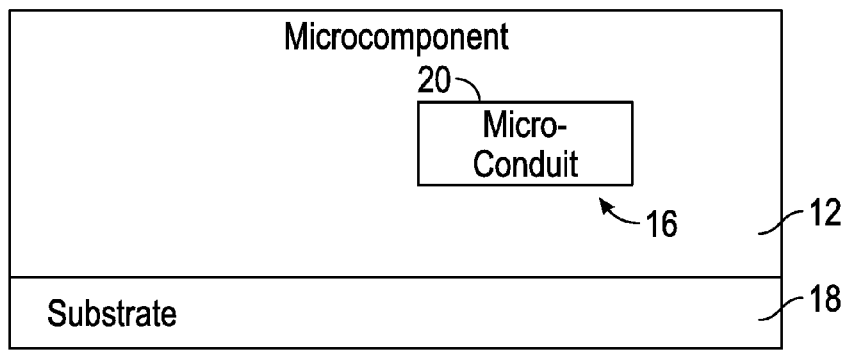
FIG. 4 is a schematic cross-section view of a microcomponent coupled to a substrate with a passage for a hydraulic circuit provided in microcomponent, shown according to an exemplary embodiment.
Figure 5:
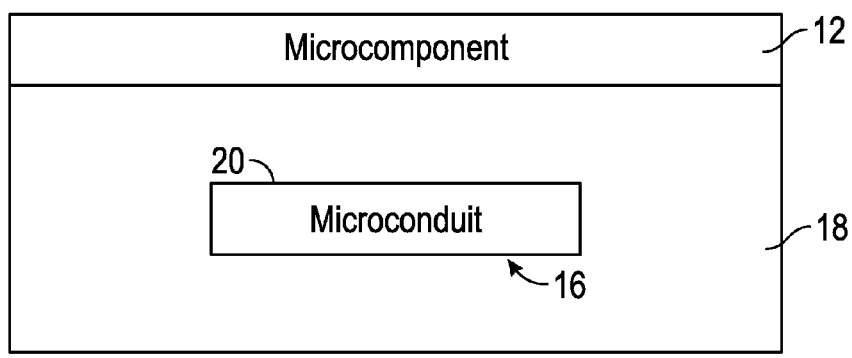
FIG. 5 is a schematic cross-section view of a microcomponent coupled to a substrate with a passage for a hydraulic circuit provided in the substrate, shown according to an exemplary embodiment.
Figure 6:
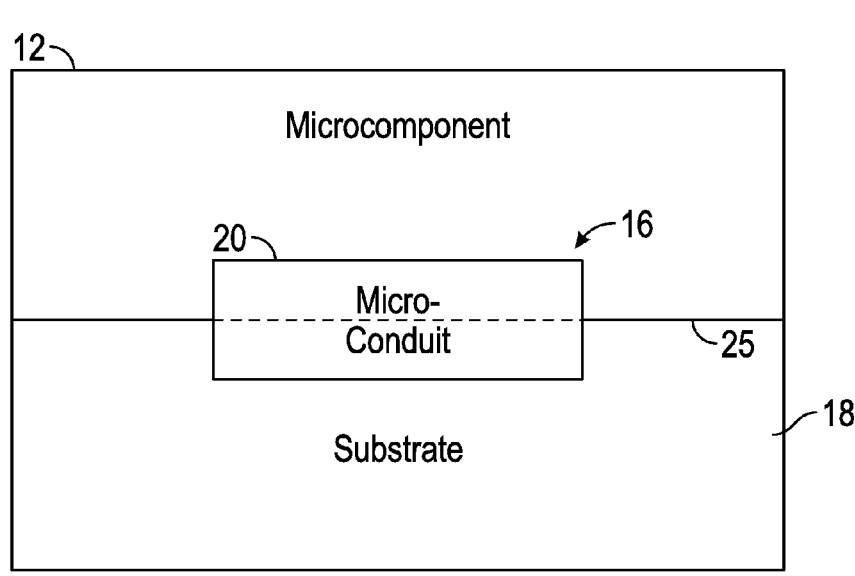
FIG. 6 is a schematic cross-section view of a microcomponent coupled to a substrate with a passage for a hydraulic circuit provided between the substrate and the microcomponent, shown according to an exemplary embodiment.

The hydraulic circuit 16 includes one or more microchannels or microconduits 20. Referring to FIG. 4, in one embodiment, the microconduit 20 may be contained completely within (or on the surface of) a microcomponent 12. Referring to FIG. 5, in another embodiment, the microconduit 20 may be contained completely within (or on the surface of) a substrate 18 to which the microcomponent 12 is coupled. Referring to FIG. 6, in another embodiment, the microconduit 20 may be contained between the microcomponent 12 and the substrate 18 on an interface or plane 25 along which the microcomponent 12 is coupled to the substrate 18. The hydraulic circuit 16 may include a number of microconduits 20 coupled together to form a continuous path for the heat transfer fluid. For example, a microconduit 20 contained within a microcomponent 12 may be in fluid communication with a microconduit 20 contained within the substrate 18 proximate to the microcomponent 12 or contained between the microcomponent 12 and the substrate 18. The heat transfer fluid may therefore enter or depart from the microcomponent 12 and may enter or depart from the substrate 18 as it travels through the hydraulic circuit 16.

Figure 7:
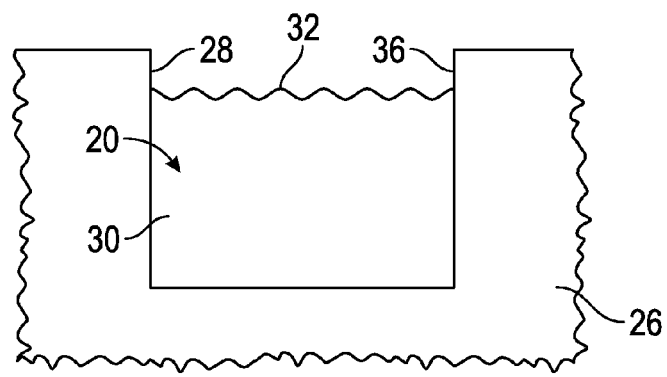
FIG. 7 is a schematic cross-section view of an open conduit for a hydraulic circuit partially filled by a liquid metal, shown according to an exemplary embodiment.
Figure 8:
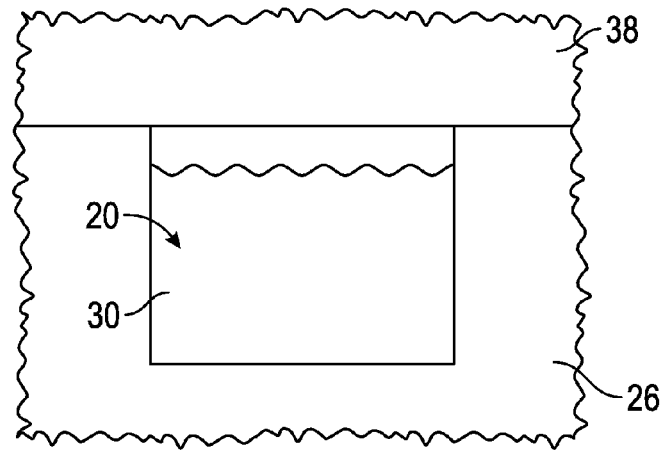
FIG. 8 is a schematic cross-section view of an enclosed conduit for a hydraulic circuit completely filled by a liquid metal, shown according to an exemplary embodiment.
Figure 9:
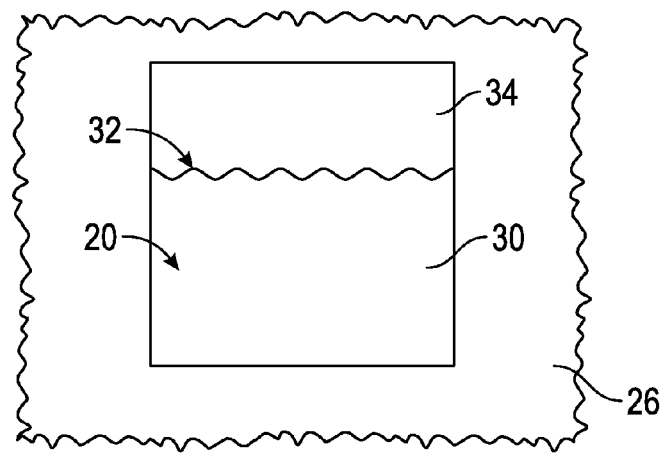
FIG. 9 is a schematic cross-section view of an enclosed conduit for a hydraulic circuit partially filled by a liquid metal, shown according to an exemplary embodiment.

Referring now to FIGS. 7-9, the microconduit 20 may be formed in a substance 26 (e.g., the microcomponent 12, the substrate 18, etc.) in any suitable manner (e.g., stamping, molding, lithography, 3D printing, etching, cutting, boring, etc.). The microconduit 20 has one or more walls 28 (e.g., sidewall, bottom wall, top wall, etc.) and contains a heat transfer fluid 30. In one embodiment, the microconduit 20 may be formed in the substance 26 as an open channel that includes an exposed surface 36 (see e.g., FIG. 7). In another embodiment, the microconduit 20 may be an enclosed channel formed by a second substance 38 coupling to the first substance 26 (see e.g., FIG. 8). In still another embodiment, the microconduit 20 may be an enclosed channel shown as a tunnel or bore through the substance 26 (see e.g., FIG. 9). An open channel, as shown in FIG. 7, may be easier to manufacture than a closed channel formed in the substance 26, as shown in FIG. 9. Fluid 30 may be retained in an open microconduit 20 via various mechanisms, such as surface tension of the liquid 30, gravity, a magnetic field, etc. A closed microconduit 20 protects the fluid 30 from external contaminants and reduces chance of the fluid 30, which may be a heated liquid, escaping the microconduit 20. While the microconduit 20 is shown as having a generally rectangular cross-section, in other embodiments, the microconduit 20 may have another cross-sectional shape (e.g., trapezoidal. semicircular, triangular, circular, ovoid, etc.). In some embodiments, the microconduit 20 may change dimensions proximate to the heat transfer site (e.g., the interface with microcomponent 12, the heat sink 14, or the substrate 18) to enhance the heat transfer to or from the fluid 30. For example, the dimensions may become long and narrow in order to increase the surface area per unit volume of the fluid.

In some embodiments, the hydraulic circuit 16 may approach the surface of the substance 26 and heat may be provided to or received from the fluid 30 through the surface of the substance (e.g., a wall 28 of the microconduit 20). In other embodiments, the fluid 30 may emerge from the substance 26 into an open channel adjacent an object to receive or reject heat directly. For example, the microconduit 20 may be formed on the surface of the substrate 18 and directly contact the microcomponent 12 or the heat sink 14. The flow of the fluid 30 through the microconduit 20 may be turbulent or may be laminar. In some embodiments, magnetic fields may be utilized to make turbulent flow laminar (e.g., in larger conduits).

In some embodiments, the fluid 30 may completely fill a cross-sectional area of the microconduit 20 (FIG. 8). In other embodiments, the fluid 30 may only partially fill a cross-sectional area of the microconduit 20 (FIGS. 7 and 9). If the fluid 30 only partially fills the microconduit 20, the liquid 30 has an interface 32 with a second fluid 34 (e.g., gas, liquid, aerosol, etc.). The second fluid 34 may be open to the atmosphere or may be contained within the microconduit 20.

The fluid 30 may be a liquid metal or metal alloy with a high thermal conductivity. Such a liquid metal coolant fluid 30 may be better able to absorb heat (e.g., due to its high thermal conductivity) from a hot element such as a microcomponent 12 into the bulk of the fluid 30. Such a liquid metal coolant fluid 30 may further be better able to transfer heat from the bulk of the fluid 30 to a cold element, such as a heat sink. According to an exemplary embodiment, the fluid 30 may be mercury (Hg); an alkali eutectic (e.g. eutectics of sodium nitrate, potassium nitrate, calcium nitrate, sodium-potassium alloy (NaK), etc.); an alloy including gallium (Ga), indium (In), and/or tin (Sn); or any other metal or metallic alloy with a suitable thermal conductivity and low melting point. As discussed in more detail below, the fluid 30 may be responsive to magnetic forces. Magnetic particles may be dispersed in the fluid 30 to make the fluid metal more responsive to magnetic forces (e.g., a ferrofluid).

Figure 10:
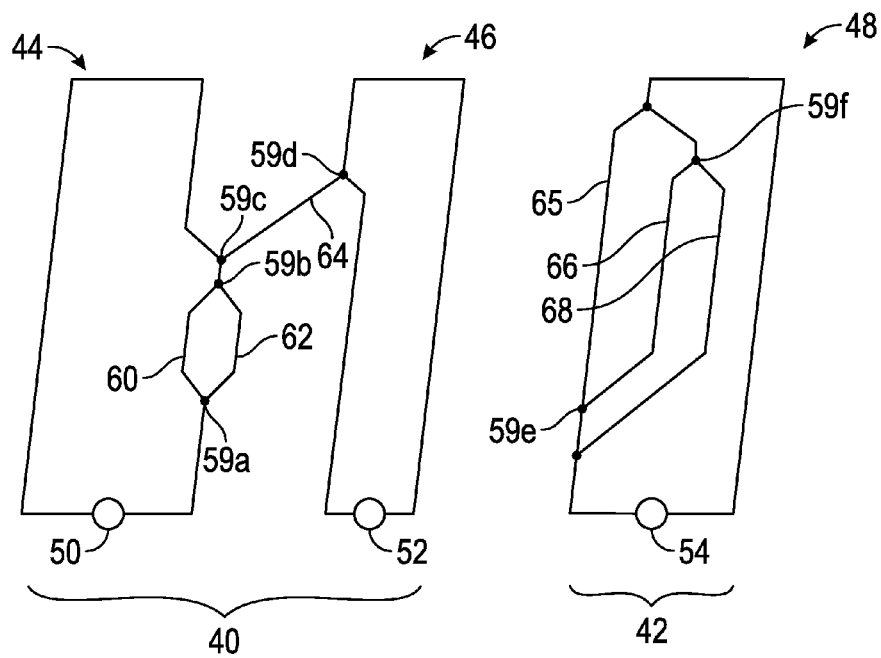
FIG. 10 is a diagram of exemplary hydraulic circuits for a heat transfer system including multiple junctions, shown according to an exemplary embodiment.

Referring to FIG. 10, one or more substrates and/or microcomponents may include one or more hydraulic circuits, shown as first circuit 40 and second circuit 42. The circuits 40 and 42 may include one or more loops, shown as a first loop 44, a second loop 46, and a third loop 48. Each hydraulic circuit or loop may include one or more pumps, shown as pumps 50, 52, and 54 that are configured to circulate the liquid metal through the microconduits. In one embodiment, one or more of the pumps 50, 52, and 54 may be traditional mechanical pumps (e.g., positive displacement pumps, lobe pumps, gear pumps, screw pumps, peristaltic pump, centrifugal pumps, etc.).

Figure 11:
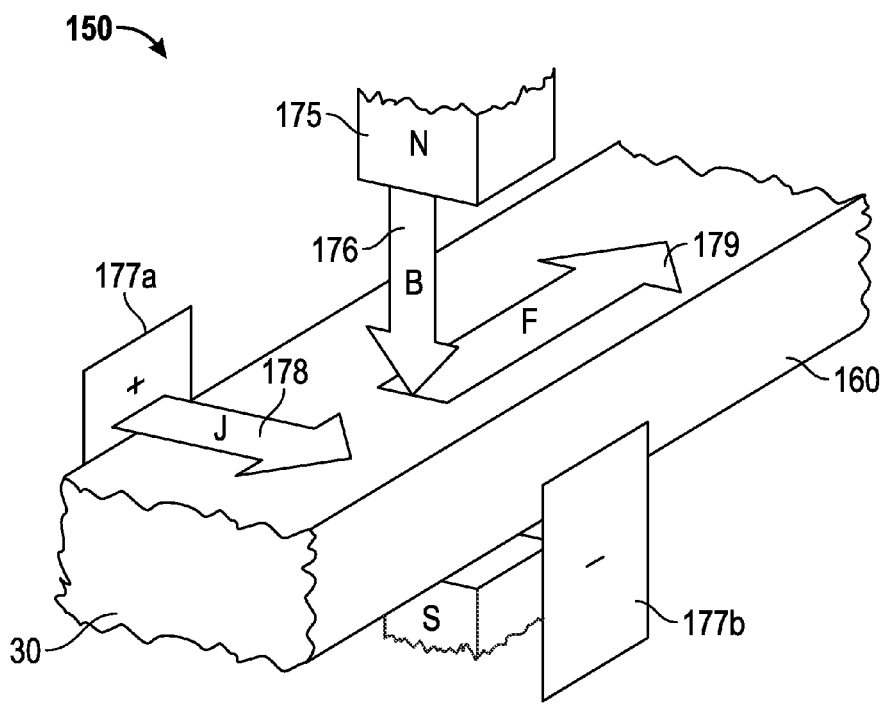
FIG. 11 is a schematic perspective view of a magnetohydrodynamic drive, shown according to an exemplary embodiment.

In other embodiments, an electric current may be applied to the fluid (e.g., a liquid metal) and one or more of the pumps 50, 52, and 54 may be a magnetohydrodynamic (MHD) pumps that utilize magnetic forces to induce a longitudinal force in the fluid, propelling (e.g., pumping, driving, pushing, pulling, retarding, etc.) the fluid through the circuits. Referring briefly to FIG. 11, a schematic diagram of a magnetohydrodynamic pump 150 is shown according to an exemplary embodiment. The MHD pump 150 includes a magnet 175 which creates a magnetic field 176 across a conduit 160. The MHD pump 150 further includes conductors 177 (e.g., pins, plates, anode, cathode, etc.), shown as a first or positive conductor 177a and a second or negative conductor 177b, which create an electric current 178 across the conduit 160. The interaction of the magnetic field 176 and the electric current 178 cause a resultant force 179 on the fluid 30 in the conduit 160, causing the fluid 30 to move in a first direction. Increasing or decreasing the magnitude of the magnetic field 176 or the electric current 178 can increase or decrease the resultant force 179 on the fluid 30. Thus, the velocity or pressure of the fluid 30 may be controlled. Similarly, reversing the magnetic field 176 or the electric current 178 reverses the direction of the resultant force 179 on the fluid 30. Thus, the velocity of the fluid 30 may be slowed, and the direction of flow maybe reversed.

Magnetohydrodynamic pumps include fewer moving components than mechanical pumps, which reduces failure modes, increases reliability, and enables a smaller pump to be utilized. The magnetic field may be generated from sources on or within a microcomponent or the substrate or from an external source. The magnetic field source may be a permanent magnet or an electromagnet. The magnetic field may be increased through the use of local ferromagnetic or paramagnetic material (e.g., a ferromagnetic or paramagnetic material located along a microconduit to locally modulate the magnetic field). The magnetic field may be constant or may vary with time. In one exemplary embodiment, the electric current in the liquid metal may be applied by an external source conductively coupled to the fluid through electric leads provided in the walls of the microconduit. In another exemplary embodiment, the electric current may be induced in the fluid.

The properties of the magnetic field generated by the magnetic pump or the current applied to or induced in the liquid metal may be varied to increase or decrease the flow of the liquid metal. The power for the generation of the magnetic field or the electric currents in the liquid metal may be supplied from an external source. According to an exemplary embodiment, the power for the magnetic pumping of the liquid metal may be provided by the same power source as the substrate or microcomponents supported by the substrate. The power for the magnetohydrodynamic pump may be in parallel or in series with the power for the substrate or microcomponents supported by the substrate. Placing the MHD pump in series with the power supply helps allow the cooling to be self-regulating, i.e., pump power varies directly with load current. Further, with respect to the relatively high current load of the microcomponent(s), the load of the MHD pump appears as a relatively small additional voltage drop. According to other exemplary embodiments, the power for the magnetic pumping of the liquid metal may be provided by a power source separate from the power source for the substrate or microcomponents supported by the substrate. In other exemplary embodiments, the microcomponent may function as the power source. According to an exemplary embodiment, the power for the magnetic pumping may be supplied by a thermoelectric generator using thermal energy from the substrate or microcomponents supported by the substrate.

The circuits 40 and 42 may include a multitude of conduit branches joined at junctions 59, shown as junctions 59a-59f. At the junctions 59, the flow of liquid metal may diverge (e.g., junction 59a, junction 59c, and junction 59e), merge together (e.g., junction 59b, junction 59d, and junction 59f). In some embodiments, conduit branches that split may join back together. For example, a second microconduit 62 may diverge from a first microconduit 60 at junction 59a, and rejoin the first microconduit 60 downstream of junction 59a at junction 59b. In other embodiments, conduit branches that split may not rejoin. For example, a third microconduit 64 may leave the first loop 44 at junction 59c and join the second loop 46 at junction 59d. Referring to the third loop 48, a second microconduit 66 may diverge from a first microconduit 65 at a junction 59e, and then join a third microconduit 68 downstream of the junction 59e at junction 59f. The circuits 40 and 42 may contain the same type of fluid or each of the circuits 40 and 42 may include a separate type of fluid with heat transfer characteristics that are suited to the particular circuit and the heat sources and heat sinks coupled to that circuit. The circuits may be provided in a substrate, in one or more microcomponents supported by the substrate, or extend between one or more substrates and microcomponents.

Referring now to FIGS. 12A-18, a junction 59 may be between a plurality of outlet conduits 72 (e.g., a first outlet conduit 72a and a second outlet conduit 72b) and a third or inlet conduit 70. In one embodiment, the fluid is a ferrofluid as described above and magnetic fields are utilized to direct the flow of the fluid from the inlet conduit 70 to one or more of the outlet conduits 72 by imparting a lateral or steering force on the fluid. The entirety of the fluid from the inlet conduit 70 may be directed to one of the outlet conduits 72, or the fluid from the inlet conduit 70 may be divided between multiple outlet conduits 72. For example, the amount of fluid directed to each of the outlet conduits 72 may be proportional to the lateral force applied to the fluid. The fluid may be directed to different outlet conduits 72 depending on the heat transfer needs of the regions through which each of the outlet conduits 72 pass. Utilizing magnetic fields to direct the flow of the fluid instead of mechanical valves reduces the number of moving components, increases reliability, and allows for a smaller package.

Figure 12A:
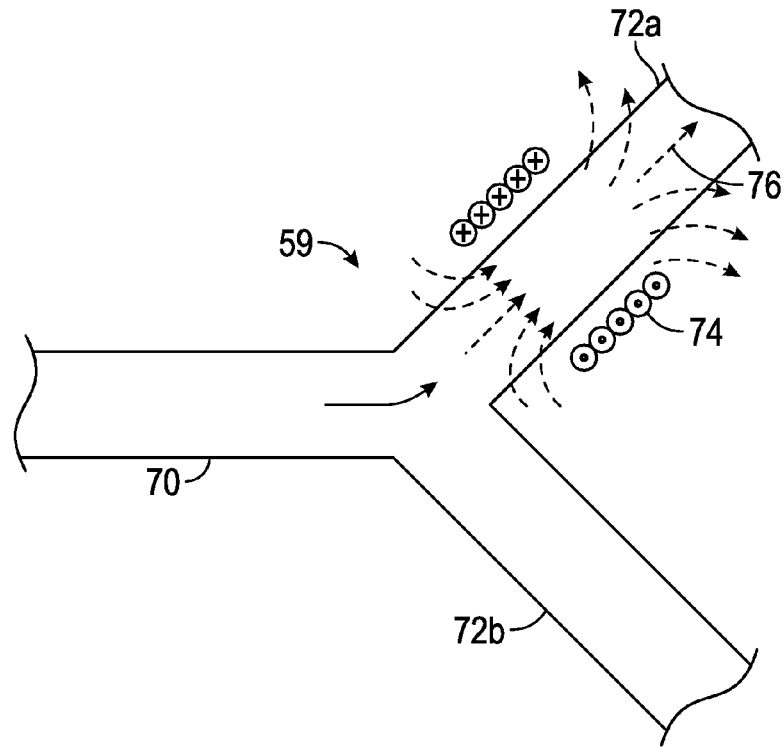
FIG. 12A is a schematic cross-section view of a hydraulic circuit junction with a device for creating a magnetic field disposed on one of the outlet conduits and directing a fluid into an outlet conduit, shown according to an exemplary embodiment.
Figure 12B:
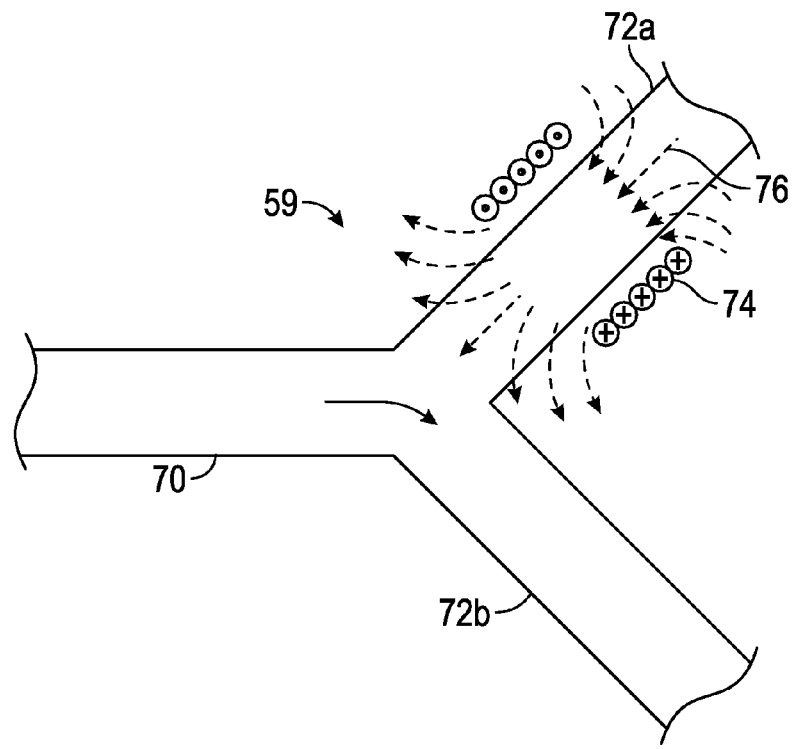
FIG. 12B is a schematic cross-section view of a hydraulic circuit junction with a device for creating a magnetic field disposed on one of the outlet conduits and directing fluid away from the outlet conduit, shown according to an exemplary embodiment.

As shown in FIGS. 12A-12B, in one embodiment, a device shown as a coil 74 (e.g., inductive winding, etc.) is disposed around a first outlet conduit 72a proximate to the junction 59. If an electric current is passed through the coil 74 in a first direction (FIG. 12A), the magnetic field 76 that is created applies a magnetic force to the fluid entering the junction 59 from the inlet conduit 70 such that the fluid is directed or drawn into the first outlet conduit 72a. If the current is passed through the coil 74 in the opposite direction (FIG. 12B), the magnet field 76 that is created applies a magnetic force to the fluid entering the junction 59 from the inlet conduit 70 such that the fluid is directed away from the first outlet conduit 72a into the second outlet conduit 72b. The coil 74 may be located only near the junction 59, or may extend along a substantial extent of conduit 72a.

Figure 13:
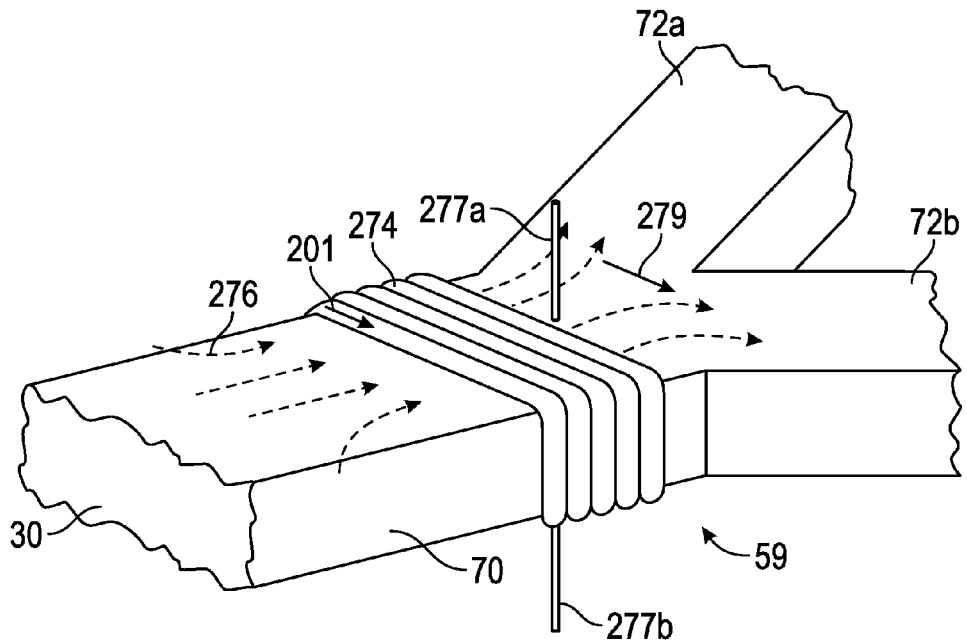
FIG. 13 is a schematic perspective view of a hydraulic circuit junction with a device for creating a magnetic field and a device for creating an electric current disposed on an inlet conduit and preferentially directing fluid toward one of the outlet conduits, shown according to an exemplary embodiment.

As shown in FIG. 13, in another exemplary embodiment, a device shown as coil 274 (e.g., inductive winding, etc.) is disposed around an inlet conduit 70 proximate to or at the junction 59. An electric current 201 passing through the coil 274 generates a generally longitudinal magnetic field 276 within the conduit (i.e., aligned with the conduit and with the flow). Electrodes 277, shown as first and second electrodes 277a, 277b, can be used to pass electric current through the liquid metal 30 in a direction generally perpendicular to the flow thereof and to the magnetic field 276. This current interacts with the magnetic field to produce a resultant force 279 (i.e., a JxB force) within the liquid metal 30. By varying either the direction of the electric current within the liquid metal (e.g., reversing the polarity of the electrodes 277) or the direction of the electric current 201 within the coil 274 (and thus the direction of the magnetic field 276 either with the flow of the liquid metal 30 or against it), this force can preferentially direct liquid metal 30 either into outlet conduit 72a or into outlet conduit 72b.

Figure 14:
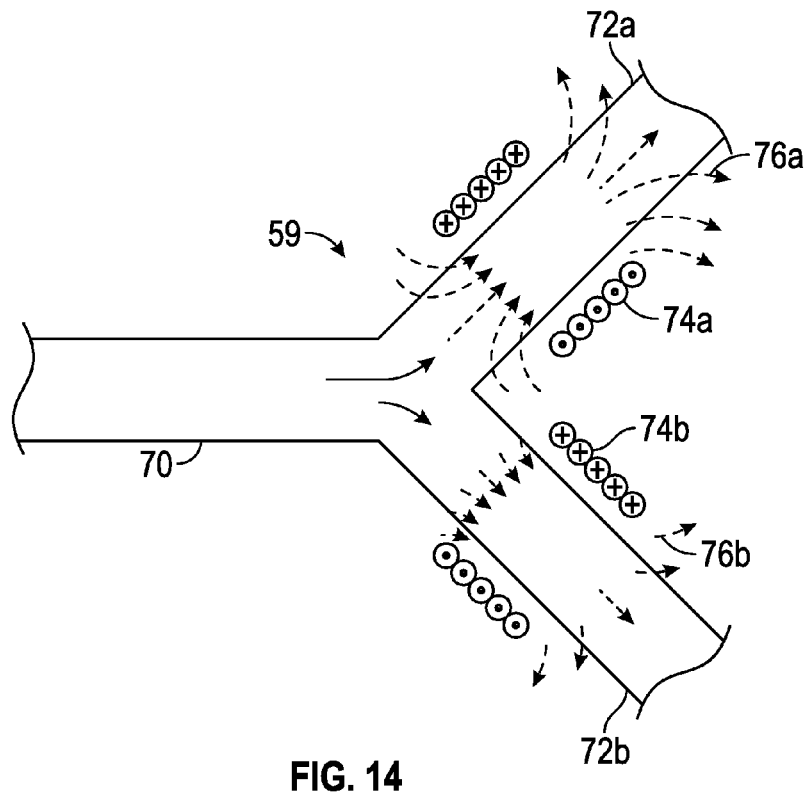
FIG. 14 is a schematic cross-section view of a hydraulic circuit junction with devices for creating a magnetic field disposed on two outlet conduits, shown according to an exemplary embodiment.

As shown in FIG. 14, in another exemplary embodiment, multiple magnetic-field producing devices may be provided. A first coil 74a may be disposed around the first outlet conduit 72a proximate to the junction 59 and a second coil 74b may be disposed around the second outlet conduit 72b proximate to the junction 59. The strength of the magnetic fields 76a and 76b may be controlled by adjusting the current passing through the coils 74a and 74b, respectively. In this way, the resulting magnetic forces may direct a portion of the fluid entering the junction 59 from the inlet conduit 70 to the first outlet conduit 72a and direct the remaining portion to the second outlet conduit 72b. For example, as shown in FIG. 14, the first coil 74a may produce a magnetic field 76a that is greater than the magnetic field 76b produced by the second coil 74b. As a result, a greater fraction of the fluid may be directed to the first outlet conduit 72a than is directed to the second outlet conduit 72b. Additional coils may be provided, for example, if the junction includes more than two outlet conduits to direct the fluid flow to the desired outlet conduit.

Figure 15:
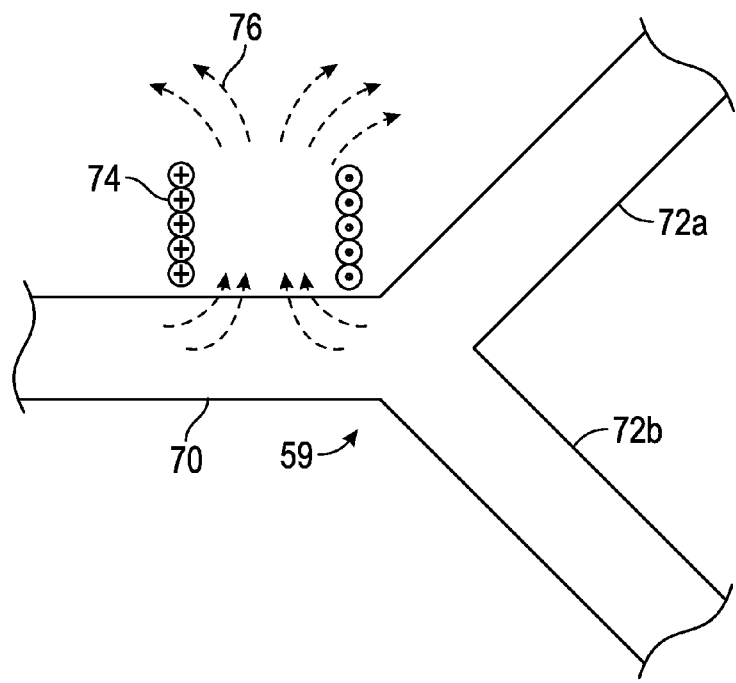
FIG. 15 is a schematic cross-section view of a hydraulic circuit junction with a device for creating a magnetic field disposed alongside an inlet conduit, shown according to an exemplary embodiment.

As shown in FIG. 15, in another exemplary embodiment, a device such as a coil 74 (e.g., inductive winding, etc.) is disposed next to the inlet conduit 70 proximate to the junction 59. An electric current passing through the coil 74 produces a magnetic field 76 normal to the longitudinal axis of the inlet conduit 70 and the flow of fluid through the inlet conduit 70. Depending on the direction of the current, the magnetic field 76 therefore applies a lateral force on the fluid towards the coil 74, as shown in FIG. 15, or away from the coil 74. This force then directs the fluid into the first outlet conduit 72a and/or the second outlet conduit 72b.

Figure 16:
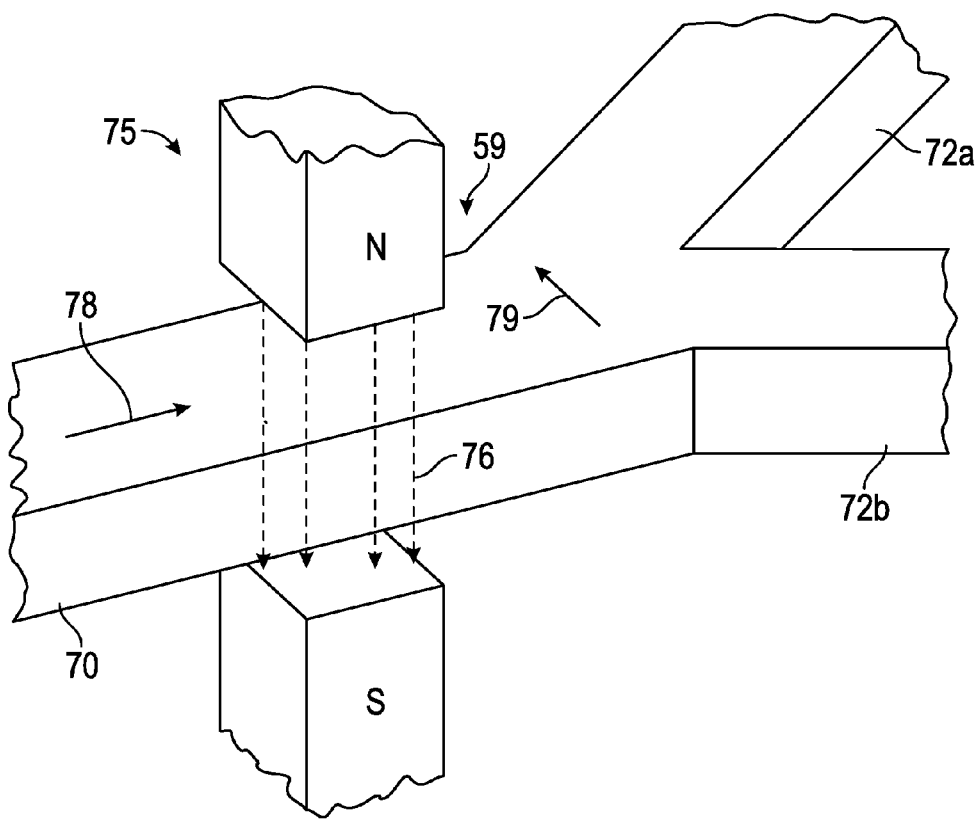
FIG. 16 is a schematic perspective view of a hydraulic circuit junction with a device for creating a magnetic field disposed alongside the inlet conduit interacting with a fluid conducting an electric current, shown according to an exemplary embodiment.

As shown in FIG. 16, in still another exemplary embodiment, the device may be a magnet 75 that produces a magnetic field 76 normal to the flow of fluid in the inlet conduit 70. If a current 78 is passed through the fluid in the longitudinal direction (e.g., either in the direction of flow or against the direction of flow), a lateral magnetic force 79 is applied to the fluid as it passes through the magnetic field 76. By reversing either the direction of the magnetic field 76 (e.g., by switching the north and south poles of the magnet 75) or by reversing the direction of the current 78, the lateral force 79 may be configured to direct the fluid either the first outlet conduit 72a or the second outlet conduit 72b. In one exemplary embodiment, the magnet 75 may be a permanent magnet. In other exemplary embodiments, the magnet 75 may be an electromagnet.

Figure 17:
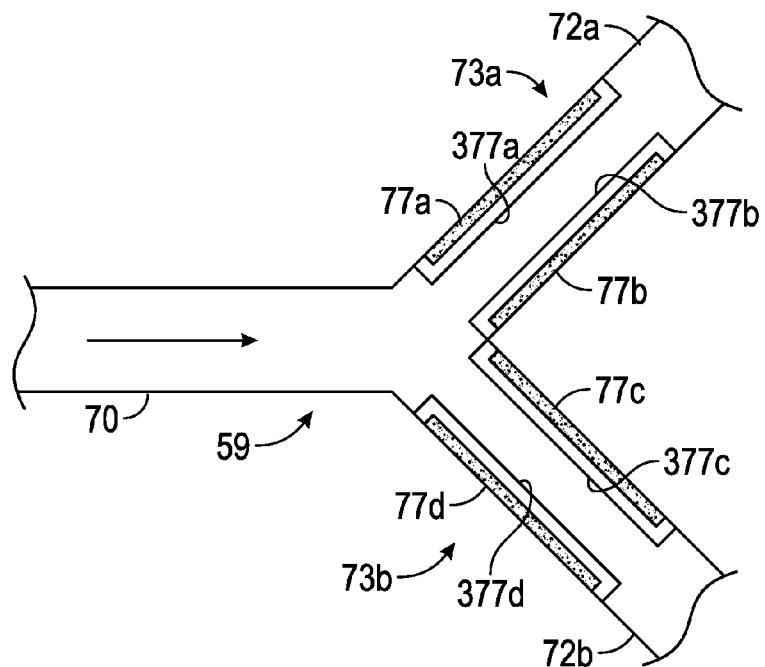
FIG. 17 is a schematic cross-section view of a hydraulic circuit junction with devices for creating electric fields disposed alongside the outlet conduits, shown according to an exemplary embodiment.

As shown in FIG. 17, in yet another exemplary embodiment, a device such as conductors (e.g., pins, plates, anode, cathode, etc.), shown as capacitive plates 77a, 77b of a first capacitor 73a and plates 77c, 77d of a second capacitor 73b, may be disposed proximate the junction 59 to produce an electric field across the junction. The plates 77 of the capacitors 73 may be covered by dielectrics 377a, 377b, 377c, 377d to conductively isolate the plates 77 from the liquid metal 30 within the conduits. While the dielectrics 377 prevent direct current flow from the capacitive plates 77 through the liquid metal 30, the presence of the liquid metal 30 between the capacitive plates 77 changes the capacitive energy (e.g., lowers the permittivity between the plates 77), and can be used to apply forces to the flowing liquid metal 30. For example, activation of the capacitor 73a in outlet conduit 72a can preferentially direct liquid metal to enter outlet conduit 72a rather than outlet conduit 72b, because the liquid metal 30 is drawn into the capacitor to lower energy state. Similarly, activation of the capacitor 73b in the outlet conduit 72b can preferentially direct liquid metal to enter outlet conduit 72b rather than outlet conduit 72a. The capacitor 73 may be located only near the junction 59, or it may extend along a substantial extent of the outlet conduit 72a, 72b to draw the liquid metal further into the desired outlet conduit. According to one embodiment, a plurality of capacitors 73 may be located adjacent to one another along the outlet conduit 72a, 72b. In use, the capacitors 73 could be activated in sequence such that the capacitor 73 nearest the junction 59 draws the liquid metal into the desired outlet conduit 72a, 72b; the next capacitor 73 could be activated and the first capacitor deactivated, thereby pulling the liquid metal farther down the desired outlet conduit 72a, 72b; and so on. A similar arrangement of capacitors may be used to control the flow of or pump the liquid metal.

Figure 18:
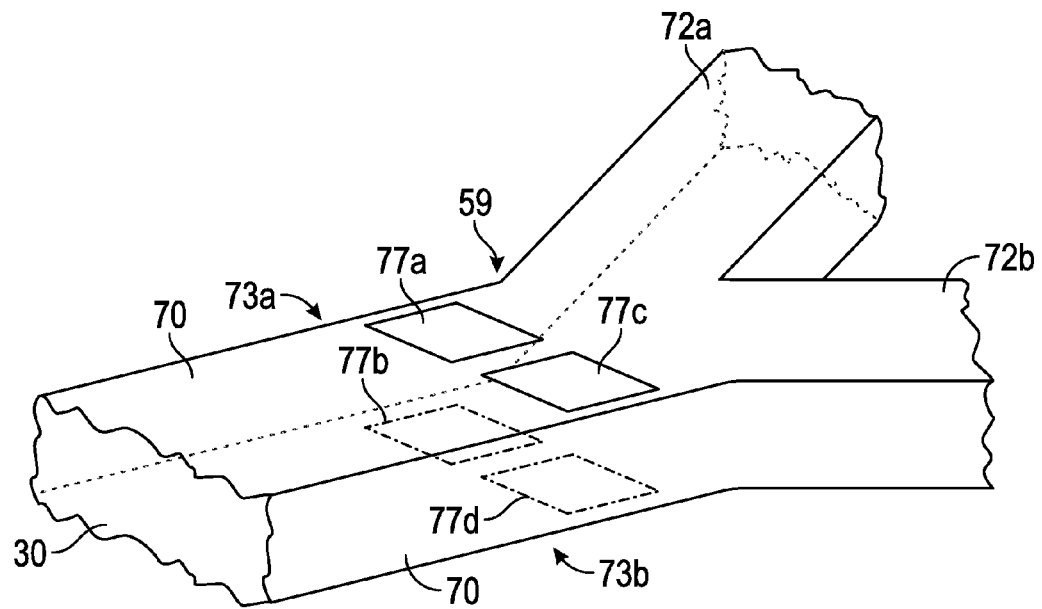
FIG. 18 is a schematic perspective view of a hydraulic circuit junction with a device for creating an electric field disposed alongside the junction between the inlet conduit and a plurality of outlet conduits, shown according to an exemplary embodiment.

In the embodiment illustrated in FIG. 18, first and second capacitors 73a, 73b are placed across the inlet conduit 70, proximate to or at the junction 59. As shown, the first capacitor 73a includes plates 77a, 77b, which are coated with a dielectric (not shown), and is radially or laterally biased (e.g., offset from a centerline of the conduit) towards the side of the inlet conduit 70 nearer the outlet conduit 72a. As shown, the second capacitor 73b includes plates 77c, 77d, which are coated with a dielectric (not shown), and is radially or laterally biased (e.g., offset from a centerline of the conduit) towards the side of the inlet conduit 70 nearer the outlet conduit 72b. Activation of the first capacitor 73a will preferentially induce flow into outlet conduit 72a, whereas activation of the second capacitor 73b will preferentially induce flow into outlet conduit 72b.

In general, once the fluid at a junction 59 has been directed towards the desired outlet conduit 72 and flow is initiated down that outlet conduit 72, the surface tension and capillary forces cause flow to continue down the outlet conduit 72 until some action causes the fluid to flow down another outlet conduit 72. The surface tension forces and/or the capillary forces may be dynamically modulated (e.g., by temperature or surface-interactivity control) to control the longitudinal (e.g., propelling, retarding) and lateral (e.g., steering) forces applied to the fluid.

For example, the junctions may use bistable fluidic structures such that the fluid flow states are stable in either of the two outlet conduits 72 or in one of more than two outlet conduits 72 and that magnetic fields 76 provide only the switching forces to direct the fluid away from one outlet conduit and towards another outlet conduit. The physical size or configuration of force applying magnetic coils or capacitors can be selected to provide enough force to induce the desired flow, thereafter the flow pattern will be maintained by surface tension forces. Similarly, the magnetic field 76 providing the steering force on the fluid only needs to be active to initiate flow in the desired direction. Once the fluid is flowing in a desired outlet conduit 72, the power to the device (e.g., coils 74, plates 77, etc.) producing the magnetic field 76 (e.g., an electromagnet) or electric field may then be turned off. Only providing power to the devices while switching the fluid flow at the junction 59 in the hydraulic circuits reduces the energy consumption of the heat transfer system 10 and reduces the latent heat being added to the heat transfer system 10, therefore making the heat transfer system 10 more efficient in cooling applications. However, in some embodiments, the devices providing steering forces to the fluid may remain powered, either because of insufficient surface tension forces for bistable switching, or to add heat to the fluid, for example in a heating application, or to bring the fluid and/or the system up to an operating temperature.

Figure 19:
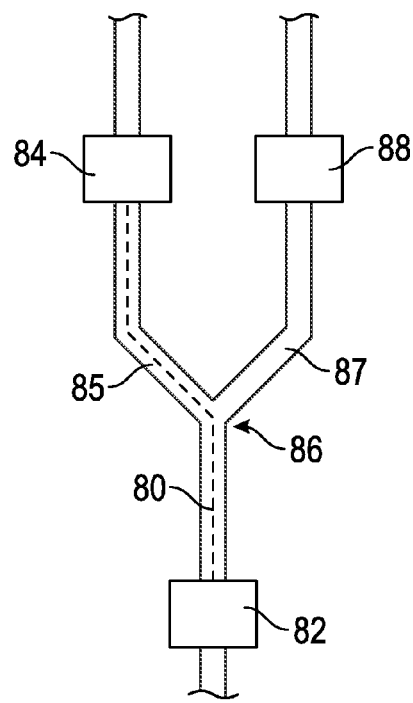
FIG. 19 is a schematic cross-section view of a hydraulic circuit in which the fluid conducts a signal between components.

Referring now to FIG. 19, the conductive nature of the fluid may be utilized to a conduct power or signals between components. For example, an electric current or signal 80 may be sent from an upstream component 82 (e.g., an emitter) to a first downstream component 84 (e.g., a first receptor) through a first conduit 85. By redirecting the fluid at a junction 86 between the upstream component 82 and the first downstream component 84, the electric current or control signal may instead be sent to a second downstream component 88 (e.g., a second receptor) through a second conduit 87. The signal may be, for example, a diagnostic signal that is utilized to confirm that the fluid is being routed to a particular component (e.g., first component 84 or second component 88).

The controls for the magnetic fields providing steering forces at the junctions (e.g., on/off, intensity, direction, etc.) and the controls for the electric current applied to the fluid may be open loop or closed-loop controls. The controls may utilize data from various sources, such as sensors (e.g., temperature sensors, pressure sensors providing pressure gradient data, flow sensors providing absolute or relative flow data, etc.), stored values, or calculated values to determine the routing of the fluid through the hydraulic circuits of the heat transfer system. The controls may modulate the magnetic field, electric field, and/or the electric current flowing through the fluid to control the magnetic and/or electric forces applied to the fluid to determine the routing of the fluid (e.g., propelling, steering, etc.). The flow control may be determined by known thermal loads of the various components. For example, if a central processing unit (CPU) is increasing in activity, heat transfer fluid may be directed through various junctions in a hydraulic circuit of the heat transfer system to provide additional cooling to the CPU. The flow may also be determined by anticipated (predicted) thermal loads of various components. For example, if a computer program indicates upcoming heavy graphics processing, then the heat transfer fluid may be directed through various junctions in a hydraulic circuit of the heat transfer system to the graphics processing unit (GPU) to provide additional cooling as the GPU increases in activity. Measured data may be utilized within a closed loop control. For example, data from a temperature sensor monitoring a CPU may be utilized to control the flow of a heat transfer fluid to the CPU to maintain the CPU within a desired operational temperature range. For example, a temperature sensor monitoring the cores of a multi-core processor may be utilized to control the flow of a heat transfer fluid among the plurality of cores to maintain the cores within desired operational temperature ranges.

Figure 20:
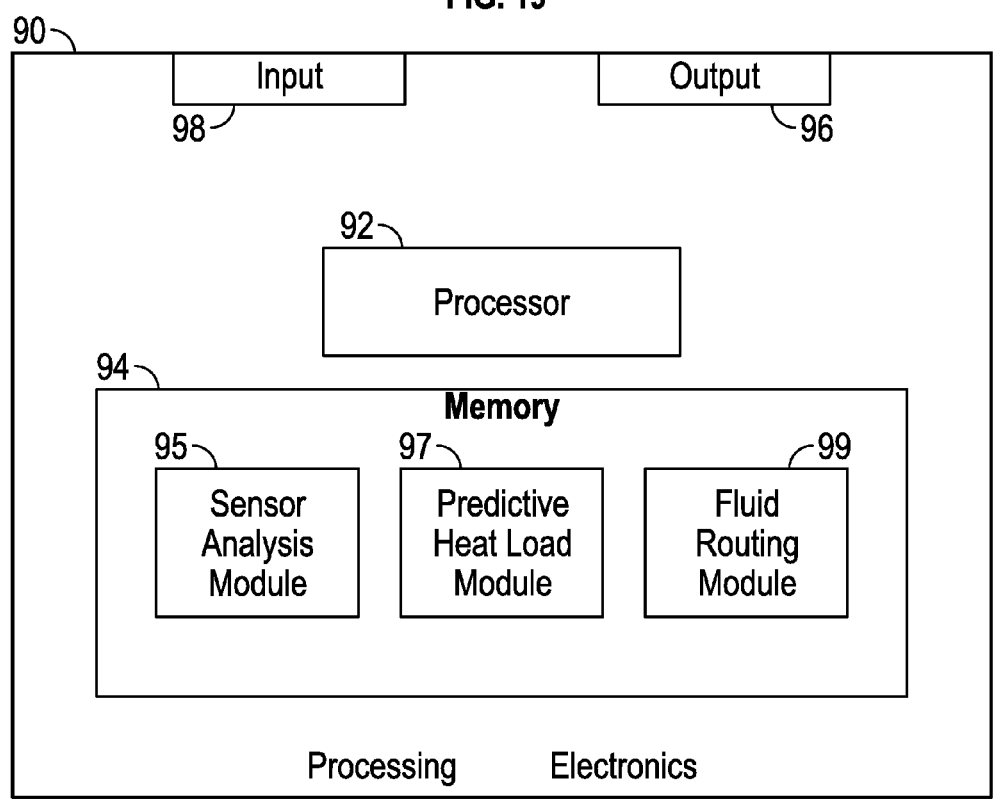
FIG. 20 is a schematic block diagram of a control system for a heat transfer system, shown according to an exemplary embodiment.

Referring to FIG. 20, according to an exemplary embodiment, the controls for the magnetic fields and/or the current applied to the fluid may include processing electronics 90. The processing electronics 90 includes a processor 92 and memory 94. The processor 92 may be or include one or more microprocessors, an application specific integrated circuit (ASIC), a circuit containing one or more processing components, a group of distributed processing components, circuitry for supporting a microprocessor, or other hardware configured for processing. According to an exemplary embodiment, the processor 94 is configured to execute computer code stored in memory 94 to complete and facilitate the activities described herein. The memory 94 can be any volatile or non-volatile memory device capable of storing data or computer code relating to the activities described herein. For example, the memory 94 is shown to include modules 95, 97, and 99 which are computer code modules (e.g., executable code, object code, source code, script code, machine code, etc.) configured for execution by the processor 94. According to an exemplary embodiment, the memory 94 includes a sensor analysis module 95, a predictive heat load module 97, and a fluid routing module 99. When executed by processor 94, the processing electronics 90 is configured to complete the activities described herein. The processing electronics 90 includes hardware circuitry for supporting the execution of the computer code of modules 95, 97, and 99. For example, the processing electronics 90 includes hardware interfaces (e.g., output 96) for communicating control signals (e.g., analog, digital) from the processing electronics 90 to devices producing magnetic or electric fields for directing the fluid in the heat transfer system 10 (e.g., pumps 50, 52, and 54, coils 74, etc.) or to devices applying an electric current to the fluid. The processing electronics 90 may also include an input 98 for receiving, for example, data from sensors (e.g., temperature sensors, pressure sensors, flow rate sensors, etc.) or data concerning the anticipated activity of microcomponents.

The construction and arrangement of the elements of the heat transfer system as shown in the exemplary embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. The elements and assemblies may be constructed from any of a wide variety of materials that provide sufficient strength or durability, in any of a wide variety of colors, textures, and combinations. Additionally, in the subject description, the word "exemplary" is used to mean serving as an example, instance or illustration. Any embodiment or design described herein as "exemplary" is not necessarily to be construed as preferred or advantageous over other embodiments or designs. Rather, use of the word exemplary is intended to present concepts in a concrete manner. Accordingly, all such modifications are intended to be included within the scope of the present disclosure. Other substitutions, modifications, changes, and omissions may be made in the design, operating conditions, and arrangement of the preferred and other exemplary embodiments without departing from the scope of the appended claims.

The order or sequence of any process or method steps may be varied or re-sequenced according to alternative embodiments. Any means-plus-function clause is intended to cover the structures described herein as performing the recited function and not only structural equivalents but also equivalent structures. Other substitutions, modifications, changes and omissions may be made in the design, operating configuration, and arrangement of the preferred and other exemplary embodiments without departing from the scope of the appended claims.

What is claimed is:

1. An apparatus for controlling heat transfer between portions of a substrate comprising:
    a substrate including at least part of a hydraulic circuit, the hydraulic circuit comprising a plurality of microconduits, the plurality of microconduits including a first microconduit and a second microconduit;
    a liquid metal flowing through the hydraulic circuit; and
    a magnetic field source configured to provide a magnetic field to selectively direct the flow of the liquid metal between the plurality of microconduits;
    wherein the flow of the liquid metal through the hydraulic circuit transfers heat between a first portion of the substrate and the liquid metal; and
    wherein the magnetic field is activated to initiate the flow of the liquid metal in a desired direction and is inactivated after the flow is initiated such that the flow of liquid metal continues in the desired direction through the hydraulic circuit via surface tension.

2. The apparatus of claim 1, wherein the liquid metal electrically transports a signal.

3. The apparatus of claim 2, wherein the first microconduit comprises a first signal receptor, and the second microconduit comprises a second signal receptor; and
wherein when the liquid metal is directed to the first microconduit, the signal is received by the first signal receptor, and when the liquid metal is directed to the second microconduit, the signal is received by the second signal receptor.

4. The apparatus of claim 1 further comprising magnetic particles dispersed within the liquid metal;
wherein the magnetic field applies a force to the magnetic particles.

5. The apparatus of claim 1, wherein the magnetic field applies a magneto-hydrodynamic force to the liquid metal by interaction with a current within the liquid metal.

6. The apparatus of claim 5, wherein the magnetohydrodynamic force is modulated by varying an electric current passing through the liquid metal.

7. The apparatus of claim 5, wherein the magnetohydrodynamic force is a function of the magnetic field.

8. The apparatus of claim 1, wherein the substrate comprises a second hydraulic circuit.

9. The apparatus of claim 8, wherein the second hydraulic circuit is separate from the first hydraulic circuit.

10. The apparatus of claim 8, wherein different types of liquid metal flow through each of the first and the second hydraulic circuits.

11. The apparatus of claim 1, wherein the hydraulic circuit comprises a third microconduit, wherein the magnetic field selectively directs the flow of the liquid metal from the third microconduit between the first microconduit and the second microconduit.

12. The apparatus of claim 11, wherein the first microconduit, the second microconduit, and the third microconduit are coupled at a junction.

13. The apparatus of claim 12, wherein the third microconduit is located upstream of the junction and at least the first and second microconduits are located downstream of the junction;
wherein the magnetic field determines what fraction of the flow flows through each of the microconduits located downstream of the junction.

14. The apparatus of claim 12, wherein the magnetic field is applied to at least one of the third microconduit and the junction.

15. The apparatus of claim 12, wherein the first microconduit extends between the junction and a second portion of the substrate, and wherein the second microconduit extends between the junction and a third portion of the apparatus.

16. The apparatus of claim 15, wherein the third portion of the apparatus is located external to the substrate.

17. The apparatus of claim 16, wherein the third portion of the apparatus comprises a microcomponent supported by the substrate.

18. The apparatus of claim 1, wherein the hydraulic circuit comprises:
a junction fluidly coupling each of the first microconduit and the second microconduit; and
a third microconduit fluidly coupled to the junction;
wherein the magnetic field provides switching forces between the first and second microconduits so as to selectively direct the flow of liquid metal between the plurality of microconduits; and
wherein after a flow of liquid metal is initiated along a desired direction, the magnetic field is deactivated and the flow of liquid metal continues along the desired direction due to a surface tension of the liquid metal.

19. The apparatus of claim 1, wherein the hydraulic circuit leaves the substrate.

20. The apparatus of claim 19, wherein the hydraulic circuit enters a microcomponent supported by the substrate.

* * * * *